(12) United States Patent
Nakagawa et al.

(10) Patent No.: US 12,438,521 B2
(45) Date of Patent: Oct. 7, 2025

(54) ACOUSTIC WAVE DEVICE AND COMPOSITE FILTER DEVICE

(71) Applicant: Murata Manufacturing Co., Ltd., Nagaokakyo (JP)

(72) Inventors: Ryo Nakagawa, Nagaokakyo (JP); Haruki Kyouya, Nagaokakyo (JP); Hiroshi Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 255 days.

(21) Appl. No.: 17/903,296

(22) Filed: Sep. 6, 2022

(65) Prior Publication Data
US 2022/0416764 A1 Dec. 29, 2022

Related U.S. Application Data

(63) Continuation of application No. PCT/JP2021/009028, filed on Mar. 8, 2021.

(30) Foreign Application Priority Data

Mar. 18, 2020 (JP) .................................. 2020-047272

(51) Int. Cl.
*H03H 9/56* (2006.01)
*H03H 9/02* (2006.01)
(Continued)

(52) U.S. Cl.
CPC ........ *H03H 9/568* (2013.01); *H03H 9/02007* (2013.01); *H03H 9/13* (2013.01); *H03H 9/703* (2013.01)

(58) Field of Classification Search
CPC ...... H03H 9/568; H03H 9/02007; H03H 9/13; H03H 9/703; H03H 9/02574; H03H 9/02818; H03H 9/205; H03H 9/14541
See application file for complete search history.

(56) References Cited

U.S. PATENT DOCUMENTS 6,380,827 B1 4/2002 Noguchi
9,374,062 B2 * 6/2016 Iwamoto ................ H03H 9/725
(Continued)

FOREIGN PATENT DOCUMENTS

CN 101796722 A 8/2010
JP 2000349591 A 12/2000
(Continued)

OTHER PUBLICATIONS

International Search Report in PCT/JP2021/009028, mailed Apr. 27, 2021, 3 pages.
(Continued)

*Primary Examiner* — John W Poos
(74) *Attorney, Agent, or Firm* — Keating & Bennett, LLP

(57) ABSTRACT

An acoustic wave device includes an IDT electrode laminated on a piezoelectric substrate and defining a first resonator, and an IDT electrode laminated on the piezoelectric substrate and defining a second resonator. The first and second resonators are connected in parallel or in series. The IDT electrode of the first resonator includes an electrode layer including an epitaxial film and the IDT electrode of the second resonator includes an electrode layer including a non-epitaxial film.

20 Claims, 7 Drawing Sheets

(51) Int. Cl.
  H03H 9/13  (2006.01)
  H03H 9/70  (2006.01)

(56) References Cited

U.S. PATENT DOCUMENTS

| | | | |
|---|---|---|---|
| 10,141,913 B2* | 11/2018 | Takamine | H03H 9/0576 |
| 10,483,942 B2* | 11/2019 | Goto | H03H 9/6483 |
| 2010/0148887 A1 | 6/2010 | Matsuda et al. | |
| 2011/0102108 A1 | 5/2011 | Fukuda | |
| 2011/0241480 A1 | 10/2011 | Nakano et al. | |
| 2016/0182008 A1* | 6/2016 | Bhattacharjee | H03H 9/02275 29/25.35 |
| 2018/0278238 A1 | 9/2018 | Kuroyanagi | |
| 2019/0190488 A1* | 6/2019 | Dasgupta | H03H 9/205 |
| 2020/0280303 A1 | 9/2020 | Takamine | |

FOREIGN PATENT DOCUMENTS

| | | |
|---|---|---|
| JP | 2003258594 A | 9/2003 |
| JP | 2011097237 A | 5/2011 |
| JP | 2011211460 A | 10/2011 |
| JP | 2018157510 A | 10/2018 |
| WO | 2009063559 A1 | 5/2009 |
| WO | 2009150786 A1 | 12/2009 |
| WO | 2019111902 A1 | 6/2019 |

OTHER PUBLICATIONS

Written Opinion in PCT/JP2021/009028, mailed Apr. 27, 2021, 4 pages.
Official Communication issued in corresponding European Patent Application No. 202180017643.5, mailed on Jun. 4, 2025, 6 pages.

* cited by examiner

ACOUSTIC WAVE DEVICE AND COMPOSITE FILTER DEVICE

CROSS REFERENCE TO RELATED APPLICATIONS

This application claims the benefit of priority to Japanese Patent Application No. 2020-047272 filed on Mar. 18, 2020 and is a Continuation Application of PCT Application No. PCT/JP2021/009028 filed on Mar. 8, 2021. The entire contents of each application are hereby incorporated herein by reference.

BACKGROUND OF THE INVENTION

1. Field of the Invention

The present invention relates to an acoustic wave device and a composite filter device in which a first resonator and a second resonator are configured to be mutually connected in parallel or in series on a piezoelectric layer.

2. Description of the Related Art

Band pass filters having a plurality of acoustic wave resonators have been widely used in the related art. Japanese Unexamined Patent Application Publication No. 2003-258594 discloses an example of such an acoustic wave resonator. In the acoustic wave resonator described in Japanese Unexamined Patent Application Publication No. 2003-258594, an electrode is provided on a piezoelectric substrate. The electrode includes an underlying electrode layer and a main electrode layer that is provided on the underlying electrode layer. The main electrode layer is composed of an oriented film which is epitaxially grown and the main electrode layer is a polycrystalline thin film having a twin crystal structure in which a diffraction pattern observed in an X-ray diffraction pole figure has a plurality of symmetry centers.

Since the electrode is a polycrystalline thin film having the twin crystal structure with a plurality of symmetry centers in the acoustic wave resonator described in Japanese Unexamined Patent Application Publication No. 2003-258594, stress migration resistance can be improved and electric power handling capability can be enhanced.

However, a band pass filter including a plurality of acoustic wave resonators such as the one described in Japanese Unexamined Patent Application Publication No. 2003-258594 has had a possibility that a harmonic wave level rises due to a reduction of linearity to cause deterioration of filter characteristics.

SUMMARY OF THE INVENTION

Preferred embodiments of the present invention provide acoustic wave devices and composite filter devices in each of which linearity is able to be improved and a harmonic wave level is able to be lowered.

An acoustic wave device according to a preferred embodiment of the present invention includes a piezoelectric layer, an IDT electrode laminated on the piezoelectric layer and defining a first resonator, and an IDT electrode laminated on the piezoelectric layer and defining a second resonator. The first resonator and the second resonator are connected in parallel or in series. The IDT electrode of the first resonator includes an electrode layer including an epitaxial film and the IDT electrode of the second resonator includes an electrode layer including a non-epitaxial film.

A composite filter device according to a preferred embodiment of the present invention includes an acoustic wave filter including an acoustic wave device according to a preferred embodiment of the present invention, and at least one band pass filter. The acoustic wave filter and at least one other band pass filter are commonly connected at one ends thereof.

In the acoustic wave devices and the composite filter devices according to preferred embodiments of the present invention, the harmonic wave level can be lowered by improving linearity when a band pass filter includes first and second resonators.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the accompanying drawings.

Each of the preferred embodiments described in the present specification is exemplary and configurations can be partially exchanged or combined with each other among different preferred embodiments.

Figure 1A:
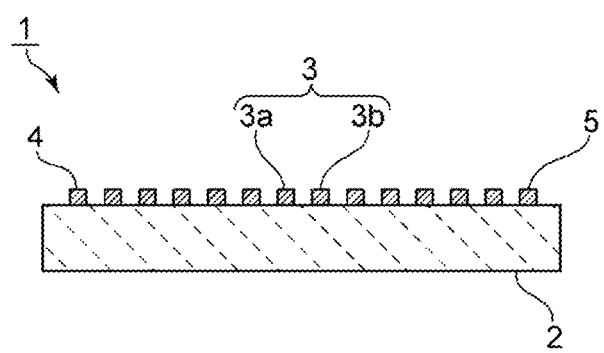
FIGS. 1A and 1B are respectively a front sectional view of an acoustic wave resonator used in an acoustic wave device according to a first preferred embodiment of the present invention and a partially-enlarged sectional view of an electrode portion thereof.
Figure 1B:
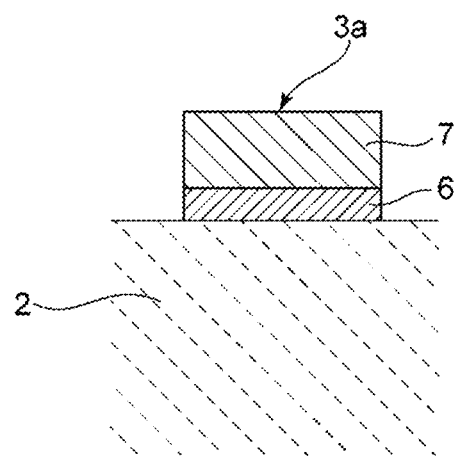
Figure 2:
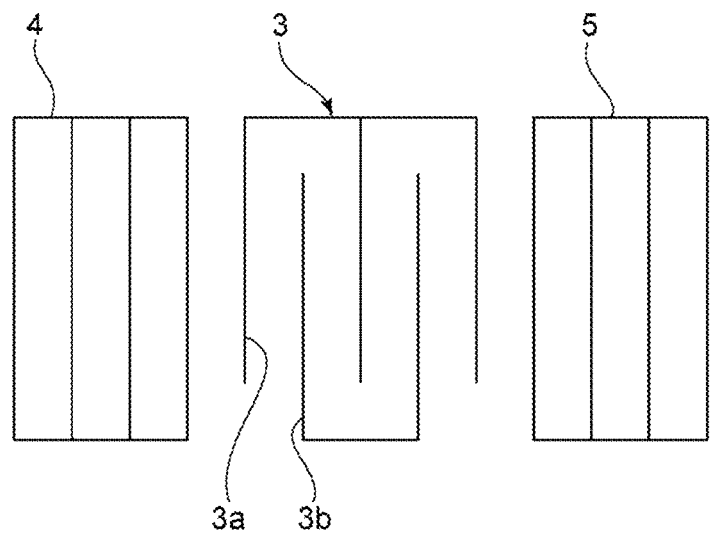
FIG. 2 is a schematic plan view illustrating an electrode structure in the acoustic wave device used in the first preferred embodiment of the present invention.

FIG. 1A is a front sectional view for explaining an acoustic wave resonator used in an acoustic wave device according to a first preferred embodiment of the present invention and FIG. 1B is a partially-enlarged sectional view of an electrode of the acoustic wave resonator. FIG. 2 is a schematic plan view illustrating an electrode structure.

An acoustic wave resonator 1 includes a piezoelectric substrate 2 defining and functioning as a piezoelectric layer. The piezoelectric substrate 2 is made of, for example, $LiTaO_3$. The piezoelectric substrate 2 may be made of other piezoelectric single crystal such as, for example, $LiNbO_3$. On the piezoelectric substrate 2, an IDT electrode 3 and reflectors 4 and 5 are provided as electrodes. A one-port acoustic wave resonator is thus provided.

The IDT electrode 3 includes first and second electrode fingers 3a and 3b that are interdigitated with each other. FIG. 1B is the partially-enlarged sectional view of a portion on which the first electrode finger 3a is provided. In the first electrode finger 3a, an underlying electrode layer 6 and a main electrode layer 7 are laminated on the piezoelectric substrate 2. The underlying electrode layer 6 is made of Ti and the main electrode layer 7 is made of Al, for example. Here, the main electrode layer is an electrode layer to excite an acoustic wave in the IDT electrode. In a laminated structure including a main electrode layer, the main electrode layer accounts for 50% or more by weight in the laminated structure.

The underlying electrode layer 6 may be made of various metal materials having a more excellent close contact property with respect to the piezoelectric substrate 2 than a main electrode layer, other than Ti. For example, NiCr or the like may be used.

The main electrode layer 7 is made of Al in the present preferred embodiment, but the main electrode layer 7 may be made of other metal such as Cu, Au, Ag, Pt, Mo, and W, for example. Alternatively, for example, the main electrode layer 7 may be made of an alloy mainly including Al or the above-described metal.

Further, at least one other metal layer may be provided between the main electrode layer and underlying electrode layer or on the main electrode layer.

Figure 3:
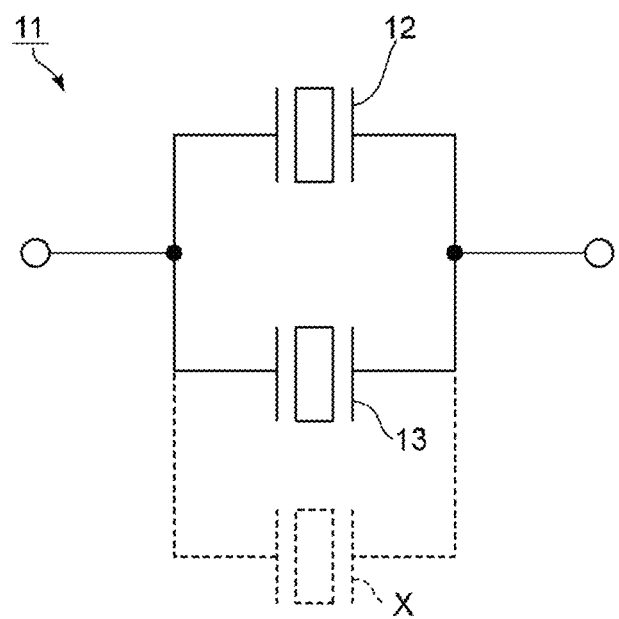
FIG. 3 is a simplified circuit diagram of the acoustic wave device according to the first preferred embodiment of the present invention.

FIG. 3 is a simplified circuit diagram of the acoustic wave device according to the first preferred embodiment of the present invention. In an acoustic wave device 11, a first resonator 12 and a second resonator 13 are connected in parallel. The first resonator 12 and the second resonator 13 are defined by one-port acoustic wave resonators.

In the acoustic wave device 11, a main electrode layer of the IDT electrode in the first resonator 12 is made of an epitaxial film and the IDT electrode of the second resonator 13 includes a main electrode layer made of a non-epitaxial film. Accordingly, linearity is improved in the acoustic wave device 11, and the harmonic wave level can be reduced or prevented when a band pass filter is structured.

Figure 4:
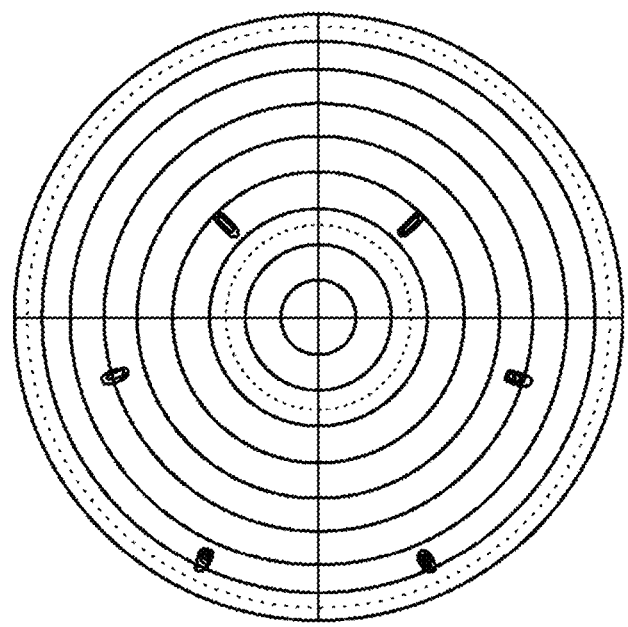
FIG. 4 is an XRD pole figure of a main electrode layer according to the first preferred embodiment of the present invention.

Here, an epitaxial film is a single crystal film in which a normal line of a crystal plane ((111) surface when using Al, for example) of the main electrode layer 7 is substantially provided with a c axis of the piezoelectric substrate 2 and a diffraction pattern observed in an X-ray diffraction pole figure (XRD pole figure) has six-fold symmetry spots. FIG. 4 shows an XRD pole figure of a main electrode layer made of Al according to the first preferred embodiment. As is clear from FIG. 4, six-fold symmetry spots appear.

In the present preferred embodiment, the first resonator includes a main electrode layer including an epitaxial film as described above.

Figure 5:
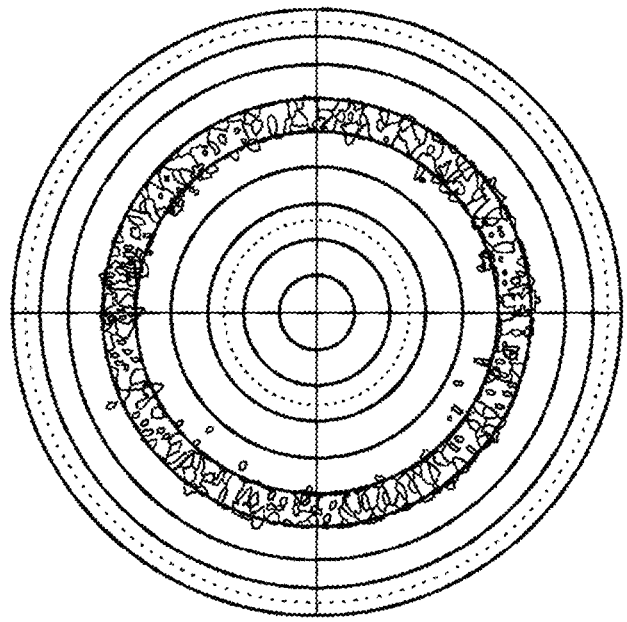
FIG. 5 is an XRD pole figure in a configuration in which a main electrode layer made of Al is a non-epitaxial film.

On the other hand, FIG. 5 is an XRD pole figure in a configuration in which a main electrode layer made of Al is a non-epitaxial film. The non-epitaxial film shows a diffraction pattern on which six-fold symmetry spots do not appear.

In the present preferred embodiment, the IDT electrode of the second resonator includes a main electrode layer which is a non-epitaxial film as described above.

Figure 6:
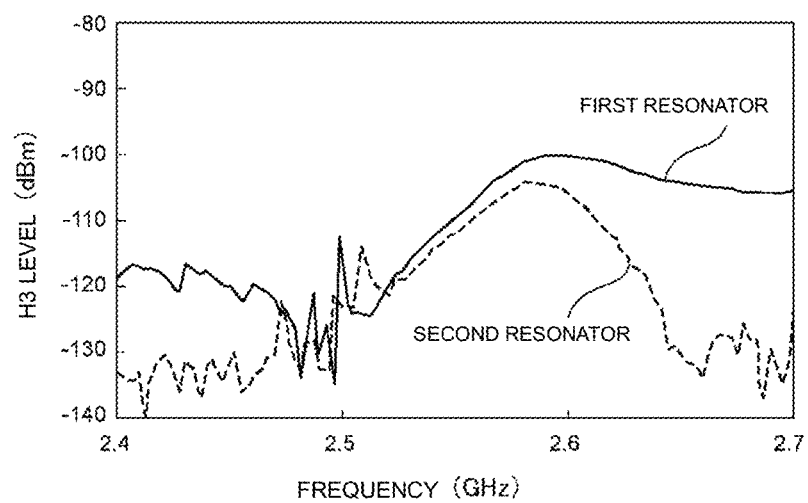
FIG. 6 is a diagram illustrating a relationship between a frequency of each of a first resonator and a second resonator and a third harmonic wave level.

The first resonator and the second resonator include mutually-different main electrode layers as described above and therefore, the first resonator and the second resonator have mutually-different frequency dependence of a harmonic wave. FIG. 6 is a diagram illustrating a relationship between a frequency of each of the first resonator and the second resonator and a third harmonic wave level. A solid line indicates a relationship on the first resonator and a dashed line indicates a relationship on the second resonator. Here, for example, the acoustic wave resonator is configured such that the underlying electrode layer 6 including a Ti film having the thickness of about 30 nm and the main electrode layer 7 including an Al film having the thickness of about 415 nm are laminated on the piezoelectric substrate 2 made of 42 degree cut $LiTaO_3$. The Al film of the first resonator is an epitaxial film and the Al film of the second resonator is a non-epitaxial film.

Here, the epitaxial film can be formed by the method described in Japanese Unexamined Patent Application Publication No. 2002-305402, for example. That is, after performing pretreatment of a piezoelectric substrate by ion etching, an underlying electrode layer made of Ti is formed. Then, a main electrode layer made of Al is formed. In this configuration, Al is epitaxially grown so that the (111) plane of Al crystal is orthogonal or substantially orthogonal to the c axis of $LiTaO_3$ of the piezoelectric substrate.

On the other hand, the non-epitaxial film of the second resonator can be obtained by forming a Ti film being the underlying electrode layer and an Al film being the main electrode layer without performing the above-described treatment by ion etching.

However, the method for forming a main electrode layer composed of an epitaxial film and a main electrode layer composed of a non-epitaxial film is not especially limited.

As can be seen from FIG. 6, frequency dependence of third harmonic wave level (H3 level) largely differs between the first resonator including the epitaxial film and the second resonator including the non-epitaxial film.

Figure 7:
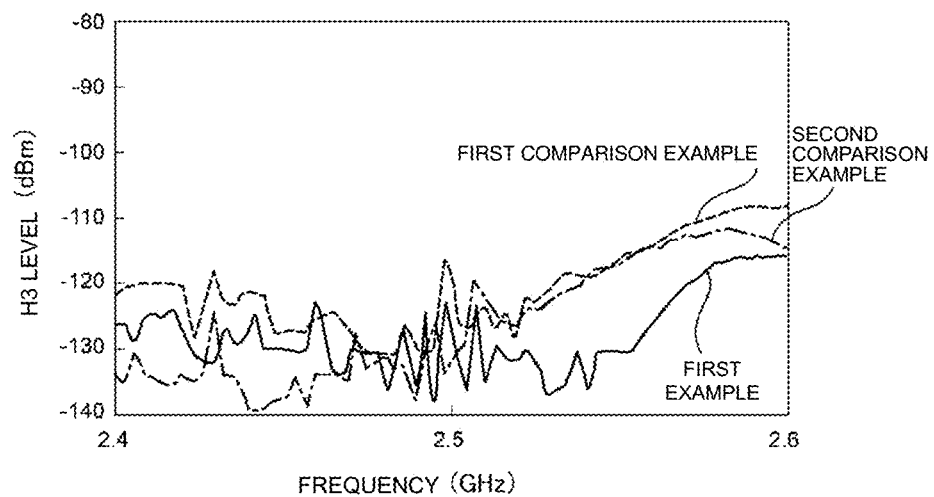
FIG. 7 is a diagram illustrating a relationship of frequencies of respective acoustic wave devices of the first preferred embodiment and first and second comparative examples with respect to the third harmonic wave level.

FIG. 7 is a diagram illustrating a relationship of frequencies of respective acoustic wave devices of a first example according to the first preferred embodiment and first and second comparative examples, described below, with respect to the third harmonic wave level (H3 level). A solid line, a dashed line, and a dashed-dotted line indicate respective results of the first example, the first comparative example, and the second comparative example.

In the first example, the first resonator 12 and the second resonator 13 are connected in parallel, as illustrated in FIG. 3.

In the first comparative example, two pieces of first resonators are connected in parallel.

In the second comparative example, two pieces of second resonators are connected in parallel.

As can be seen from FIG. 7, according to the first example in which the first resonator and the second resonator are connected in parallel, the signal strength of the third harmonic wave is significantly smaller, namely about 5 dBm to 10 about dBm, in a range from about 2.5 GHz to about 2.6 GHz inclusive, compared to the first comparative example and the second comparative example. It is considered that this is because third harmonic wave signals are canceled in the frequency band from about 2.5 GHz to about 2.6 GHz inclusive since the frequency dependence of a third harmonic wave differs between the first resonator and the second resonator.

Figure 8:
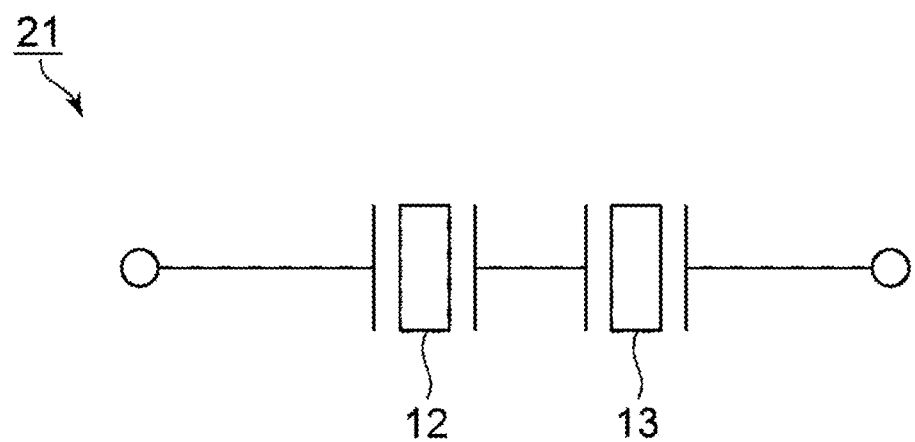
FIG. 8 is a simplified circuit diagram of an acoustic wave device according to a second preferred embodiment of the present invention.

FIG. 8 is a simplified circuit diagram of an acoustic wave device according to a second preferred embodiment of the present invention. In an acoustic wave device 21, the first resonator 12 and the second resonator 13 are connected in series. The first resonator 12 and the second resonator 13 may be connected in parallel or connected in series.

Further, at least one third resonator X may be further connected in parallel as illustrated with a dashed line in FIG. 3, and at least one acoustic wave resonator may be further connected in series also in the acoustic wave device 21.

Figure 9:
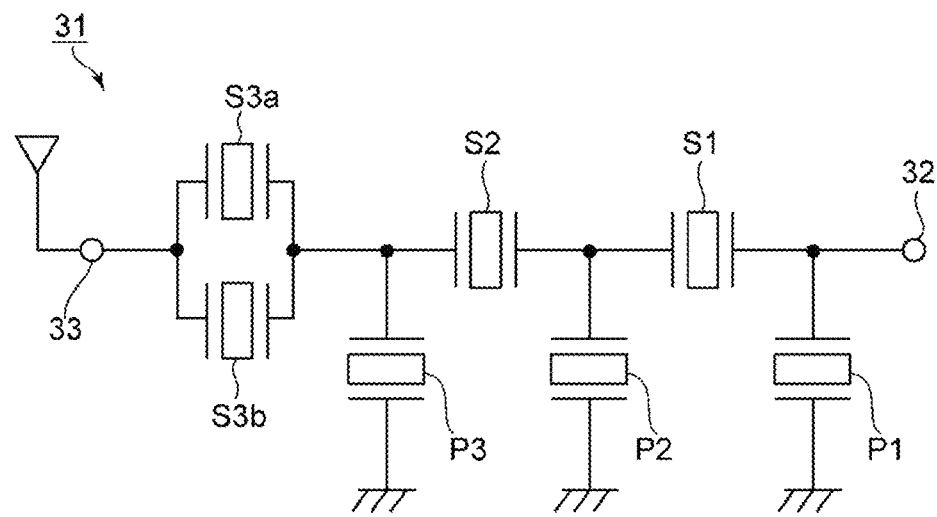
FIG. 9 is a circuit diagram of a ladder filter according to a third preferred embodiment of the present invention.

FIG. 9 is a circuit diagram of a ladder filter 31 according to a third preferred embodiment of the present invention. The ladder filter 31 is, for example, a transmission filter.

In the ladder filter 31, a plurality of acoustic wave resonators are connected between an input terminal 32 and an antenna terminal 33. That is, series arm resonators S1, S2, S3a, and S3b are provided on a series arm coupling the input terminal 32 and the antenna terminal 33. Further, parallel arm resonators P1, P2, and P3 are respectively provided on a plurality of parallel arms coupling the series arm and a ground potential. These series arm resonators S1, S2, S3a, and S3b and parallel arm resonators P1, P2, and P3 are all defined by an acoustic wave resonator.

The series arm resonator S3a and the series arm resonator S3b are divided acoustic wave resonators obtained by dividing one acoustic wave resonator in parallel. Specifically, the series arm resonator S3a and the series arm resonator S3b are parallel divided resonators that are obtained by dividing one series arm resonator in parallel. Further, the series arm resonator S3a and the series arm resonator S3b are acoustic wave resonators that are mutually connected in parallel at a connection node on a path coupling the input terminal 32 and the antenna terminal 33. Here, divided acoustic wave resonators are acoustic wave resonators that are connected in parallel or in series so as to have the same or substantially the same impedance as an impedance of an acoustic wave resonator before being divided. That is, total electrostatic capacitance of divided acoustic wave resonators is the same or substantially the same as electrostatic capacitance of an acoustic wave resonator before being divided. Here, when the series arm resonator S3a and the series arm resonator S3b are series divided resonators obtained by dividing one series arm resonator in series, the series arm resonator S3a and the series arm resonator S3b are mutually connected in series on the path coupling the input terminal 32 and the antenna terminal 33 and no parallel arm resonator is connected between the series arm resonator S3a and the series arm resonator S3b.

Any one parallel arm resonator among the parallel arm resonators P1 to P3 may be a divided acoustic wave resonator. In this configuration, divided acoustic wave resonators are mutually connected in parallel or in series on a path coupling a connection node, to which the any one parallel arm resonator is connected, and the ground potential on the path coupling the input terminal 32 and the antenna terminal 33.

In the third preferred embodiment, the series arm resonator S3a includes the first resonator of a preferred embodiment of the present invention and the series arm resonator S3b includes the second resonator of a preferred embodiment of the present invention.

The series arm resonators S3a and S3b are divided acoustic wave resonators obtained by divided one series arm resonator into two and are configured in accordance with a preferred embodiment of the present invention in the ladder filter 31, so as to improve linearity. Accordingly, the harmonic wave level can be effectively reduced or prevented and favorable filter characteristics can be obtained in the ladder filter 31.

In the ladder filter 31, the closest resonator to the antenna terminal 33 largely influences the filter characteristics. Accordingly, it is preferable that the closest acoustic wave resonator to the antenna terminal 33 is the series arm resonator S3a and the series arm resonator S3b which define an acoustic wave device configured according to a preferred embodiment of the present invention.

FIG. 9 illustrates the ladder filter 31, but the acoustic wave device according to the present preferred embodiment is widely applicable to filters including a plurality of acoustic wave resonators other than a ladder filter. Further, FIG. 9 illustrates the series arm resonators S3a and S3b that are divided and are connected in parallel. However, the series arm resonator S2 may be divided in series into the first and second resonators, for example.

Further, the series arm resonator S2 may be the first resonator and the parallel arm resonator P3 may be the second resonator, for example. That is, one of a series arm resonator and a parallel arm resonator that are connected with each other may be the first resonator and the other may be the second resonator. In this configuration as well, the harmonic wave level can be effectively reduced or prevented by improving the linearity in accordance with preferred embodiments of the present invention.

Figure 10:
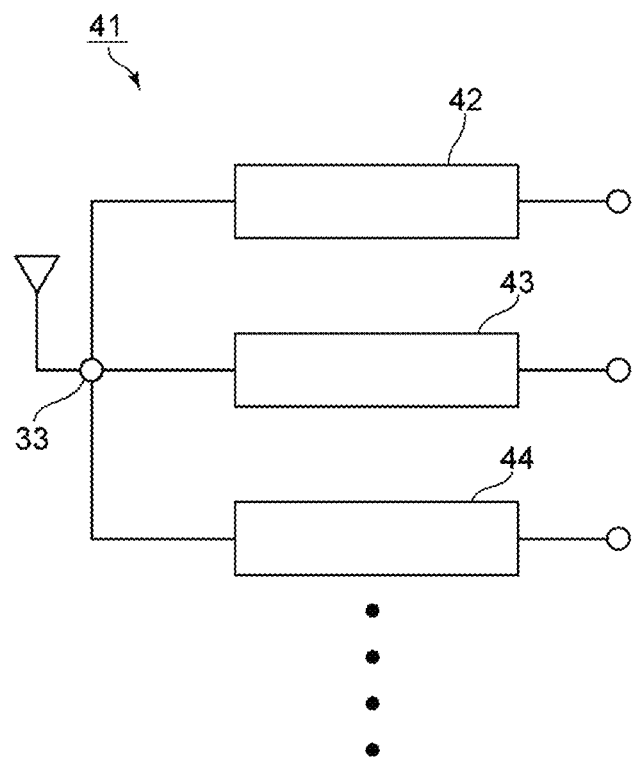
FIG. 10 is a circuit diagram for explaining a multiplexer according to a fourth preferred embodiment of the present invention.

FIG. 10 is a circuit diagram for explaining a multiplexer according to a fourth preferred embodiment of the present invention. In a multiplexer 41, first, second, third, . . . band pass filters 42, 43, 44, . . . are connected to the antenna terminal 33. That is, one ends of a plurality of band pass filters 42, 43, 44, . . . are commonly connected. Pass bands of the band pass filters 42, 43, 44, . . . are different from each other.

In the multiplexer 41, an acoustic wave filter configured in accordance with a preferred embodiment of the present invention may be used as at least one of the band pass filters 42, 43, 44, . . . . Accordingly, filter characteristics of the multiplexer 41 can be improved.

Figure 11:
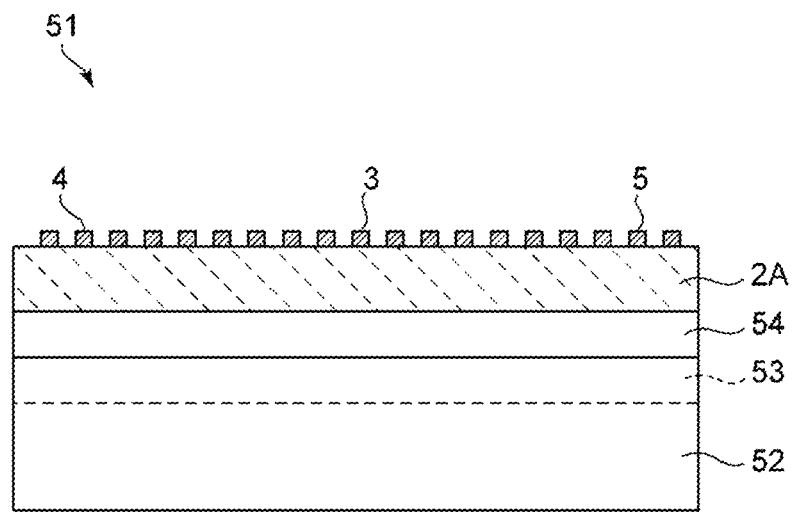
FIG. 11 is a front sectional view illustrating a modification of an acoustic wave resonator according to a preferred embodiment of the present invention.

FIG. 11 is a front sectional view illustrating a modification of an acoustic wave resonator according to a preferred embodiment of the present invention. In an acoustic wave resonator 51, a low acoustic velocity film 54 and a piezoelectric layer 2A are laminated on a supporting substrate 52. That is, the piezoelectric layer 2A which is thin is provided instead of the piezoelectric substrate 2 illustrated in FIG. 1A. Further, the low acoustic velocity film 54 is provided between the piezoelectric layer 2A and the supporting substrate 52. The low acoustic velocity film 54 is made of a low acoustic velocity material. The supporting substrate 52 is made of a high acoustic velocity material. The low acoustic velocity material is a material in which an acoustic velocity of a bulk wave propagating through this material is lower than an acoustic velocity of a bulk wave propagating through the piezoelectric layer 2A. The high acoustic velocity material is a material in which an acoustic velocity of a bulk wave propagating through this material is higher than an acoustic velocity of an acoustic wave propagating through the piezoelectric layer 2A.

The low acoustic velocity material may be an arbitrary material that has a bulk-wave acoustic velocity of a lower acoustic velocity than a bulk wave propagating through a piezoelectric layer. Examples of such a low acoustic velocity material may include various materials such as silicon oxide, glass, silicon oxynitride, tantalum oxide, a compound obtained by adding fluorine, carbon, boron, hydrogen, or a silanol group to silicon oxide, and a medium including the above-described material as a main component.

Examples of the high acoustic velocity material may include various materials such as aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, diamond-like carbon (DLC) film, or diamond, a medium including the above-described material as a main component, and a medium including a mixture of the above-described materials as a main component.

Thus, a piezoelectric substrate may be provided in which the low acoustic velocity film 54 and the piezoelectric layer 2A are laminated on the supporting substrate 52 made of a high acoustic velocity material. Also, a high acoustic velocity film 53 illustrated with a dashed line may be laminated between the supporting substrate 52 and the low acoustic velocity film 54. The high acoustic velocity film 53 is made of the high acoustic velocity material. In this configuration, the supporting substrate 52 may be made of a material other than a high acoustic velocity material.

Figure 12:
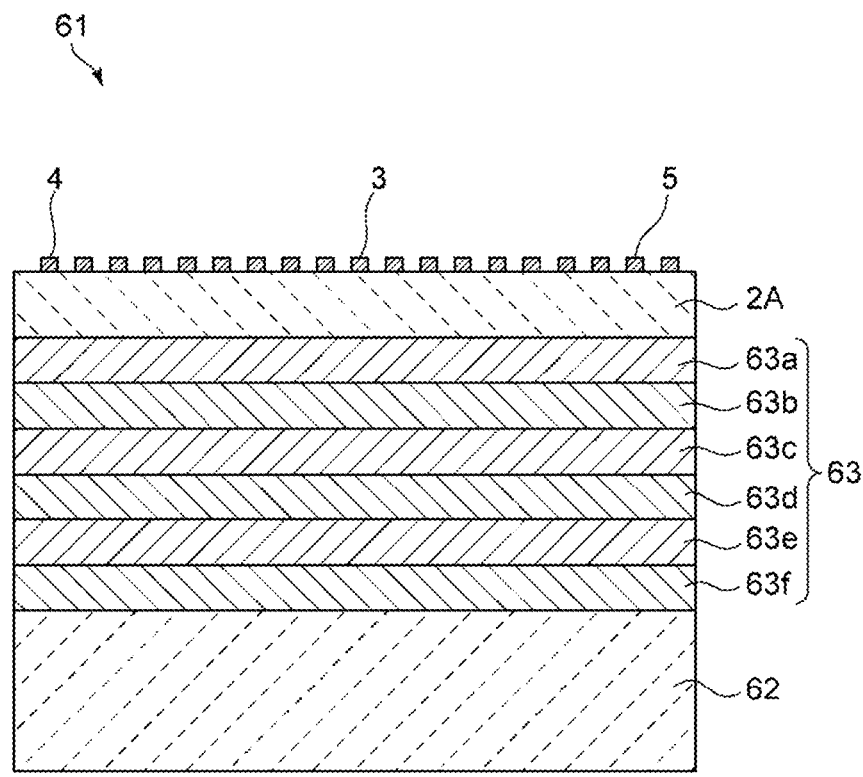
FIG. 12 is a front sectional view illustrating another modification of an acoustic wave resonator according to a preferred embodiment of the present invention.

FIG. 12 is a front sectional view illustrating another modification of a configuration of an acoustic wave resonator according to a preferred embodiment of the present invention. In an acoustic wave resonator 61, an acoustic multilayer film 63 is laminated between the piezoelectric layer 2A and a supporting substrate 62. The supporting substrate 62 is made of an arbitrary insulator such as, for example, Si or semiconductor.

The acoustic multilayer film 63 includes low acoustic impedance layers 63a, 63c, and 63e whose acoustic impedance is relatively low and high acoustic impedance layers 63b, 63d, and 63f whose acoustic impedance is relatively high.

The low acoustic impedance layers 63a, 63c, and 63e are made of, for example, a material whose acoustic impedance is relatively low, such as silicon oxide. Silicon oxide is expressed by $SiO_x$ (x is an integer). A value of x is not especially limited, but each low acoustic impedance layer is made of $SiO_2$ in the present preferred embodiment. A material of the plurality of low acoustic impedance layers is not limited to the above-described material. Any material may be used as long as an acoustic impedance of the material is relatively low.

The high acoustic impedance layers 63b, 63d, and 63f may be, for example, metal such as Pt and W or dielectric such as AlN and SiN. A material of the plurality of high acoustic impedance layers may be any material as long as an acoustic impedance of the material is relatively high.

With the use of the acoustic multilayer film 63, excited acoustic waves can be confined in the piezoelectric layer 2A. A piezoelectric substrate including the acoustic multilayer film 63 may be provided. However, acoustic waves may be confined by providing a cavity, instead of the acoustic multilayer film 63. In this configuration, a cavity may be provided in the supporting substrate 62 and the piezoelectric layer 2A may be provided on the supporting substrate so as to cover the cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer;
an IDT electrode laminated on the piezoelectric layer and defining a first resonator; and
an IDT electrode laminated on the piezoelectric layer and defining a second resonator; wherein
the first resonator and the second resonator are connected in parallel or in series;
the IDT electrode of the first resonator includes an electrode layer including an epitaxial film and the IDT electrode of the second resonator includes an electrode layer including a non-epitaxial film; and
the first resonator and the second resonator are a plurality of divided resonators provided by dividing one resonator so as to have an equivalent impedance to an impedance before being divided.

2. The acoustic wave device according to claim 1, wherein the first resonator and the second resonator are each parallel divided resonators.

3. The acoustic wave device according to claim 1, wherein the first resonator and the second resonator are each series divided resonators.

4. The acoustic wave device according to claim 1, wherein the acoustic wave device is included in an acoustic wave filter.

5. The acoustic wave filter according to claim 4, wherein the acoustic wave filter is included in a transmission filter.

6. An acoustic wave filter comprising:
an antenna terminal;
an acoustic wave device; and
a plurality of resonators; wherein
the acoustic wave device includes:
a piezoelectric layer;
an IDT electrode laminated on the piezoelectric layer and defining a first resonator; and
an IDT electrode laminated on the piezoelectric layer and defining a second resonator;
the plurality of resonators include the first resonator and the second resonator;
the first resonator and the second resonator are connected in parallel or in series;
the IDT electrode of the first resonator includes an electrode layer including an epitaxial film and the IDT electrode of the second resonator includes an electrode layer including a non-epitaxial film; and
the first resonator and the second resonator are closest to the antenna terminal among the plurality of resonators.

7. The acoustic wave filter according to claim 6, wherein the acoustic wave filter is included in a transmission filter.

8. A composite filter device comprising:
an acoustic wave filter; and
at least one band pass filter; wherein
the acoustic wave filter and the at least one band pass filter are commonly connected at ends thereof;
the acoustic wave filter includes an acoustic wave device;
the acoustic wave device includes:
a piezoelectric layer;
an IDT electrode laminated on the piezoelectric layer and defining a first resonator; and
an IDT electrode laminated on the piezoelectric layer and defining a second resonator;

the first resonator and the second resonator are connected in parallel or in series; and the IDT electrode of the first resonator includes an electrode layer including an epitaxial film and the IDT electrode of the second resonator includes an electrode layer including a non-epitaxial film.

9. The composite filter device according to claim 8, wherein the composite filter device is included in a multiplexer.

10. The acoustic wave filter according to claim 8, wherein the acoustic wave filter is included in a transmission filter.

11. An acoustic wave device comprising:
a piezoelectric layer;
an IDT electrode laminated on the piezoelectric layer and defining a first resonator; and
an IDT electrode laminated on the piezoelectric layer and defining a second resonator;
wherein the first resonator and the second resonator are connected in parallel or in series;
the IDT electrode of the first resonator includes an electrode layer including an epitaxial film and the IDT electrode of the second resonator includes an electrode layer including a non-epitaxial film;
each of the IDT electrodes has a laminated structure including an underlying electrode layer and a main electrode layer; and
the first resonator and the second resonator are a plurality of divided resonators provided by dividing one resonator so as to have an equivalent impedance to an impedance before being divided.

12. The acoustic wave device according to claim 11, wherein the first resonator and the second resonator are each parallel divided resonators.

13. The acoustic wave device according to claim 11, wherein the first resonator and the second resonator are each series divided resonators.

14. The acoustic wave device according to claim 11, wherein the acoustic wave device is included in an acoustic wave filter.

15. The acoustic wave filter according to claim 14, wherein the acoustic wave filter is included in a transmission filter.

16. An acoustic wave filter comprising:
an antenna terminal;
an acoustic wave device; and
a plurality of resonators; wherein
the acoustic wave device includes:
a piezoelectric layer;
an IDT electrode laminated on the piezoelectric layer and defining a first resonator; and
an IDT electrode laminated on the piezoelectric layer and defining a second resonator;
the plurality of resonators include the first resonator and the second resonator;
the first resonator and the second resonator are connected in parallel or in series;
the IDT electrode of the first resonator includes an electrode layer including an epitaxial film and the IDT electrode of the second resonator includes an electrode layer including a non-epitaxial film;
each of the IDT electrodes has a laminated structure including an underlying electrode layer and a main electrode layer; and
the first resonator and the second resonator are closest to the antenna terminal among the plurality of resonators.

17. The acoustic wave filter according to claim 16, wherein the acoustic wave filter is included in a transmission filter.

18. A composite filter device comprising:
an acoustic wave filter; and
at least one band pass filter; wherein
the acoustic wave filter and the at least one band pass filter are commonly connected at ends thereof;
the acoustic wave filter includes an acoustic wave device;
the acoustic wave device includes:
a piezoelectric layer;
an IDT electrode laminated on the piezoelectric layer and defining a first resonator; and
an IDT electrode laminated on the piezoelectric layer and defining a second resonator;
the first resonator and the second resonator are connected in parallel or in series;
the IDT electrode of the first resonator includes an electrode layer including an epitaxial film and the IDT electrode of the second resonator includes an electrode layer including a non-epitaxial film; and
each of the IDT electrodes has a laminated structure including an underlying electrode layer and a main electrode layer.

19. The composite filter device according to claim 18, wherein the composite filter device is included in a multiplexer.

20. The acoustic wave filter according to claim 18, wherein the acoustic wave filter is included in a transmission filter.

* * * * *